United States Patent [19]
Leidich

[11] 3,845,405
[45] Oct. 29, 1974

[54] COMPOSITE TRANSISTOR DEVICE WITH OVER CURRENT PROTECTION

[75] Inventor: Arthur John Leidich, Flemington, N.J.

[73] Assignee: RCA Corporation, New York, N.Y.

[22] Filed: May 24, 1973

[21] Appl. No.: 363,599

[52] U.S. Cl. ............ 330/207 P, 307/202, 307/237, 307/300, 317/33 R
[51] Int. Cl. ............ H03f 3/04
[58] Field of Search ... 330/25, 29, 38 M, 85, 207 P; 307/202, 300, 237; 317/33 R

[56] References Cited

UNITED STATES PATENTS

| | | | |
|---|---|---|---|
| 3,383,527 | 5/1968 | Yeager | 317/33 R |
| 3,678,408 | 7/1972 | Suzuki | 330/207 P |
| 3,714,600 | 1/1973 | Kuijk et al. | 330/25 |

*Primary Examiner*—John Kominski
*Assistant Examiner*—James B. Mullins

[57] ABSTRACT

The base-emitter junctions of a power transistor and an auxiliary transistor are paralleled. The smaller collector current of the auxiliary transistor can be sampled so as to indirectly sample the larger collector current of the power transistor. When the indirect sampling indicates that the collector current in the power transistor is tending to exceed its rated maximum value, its base and emitter electrodes are clamped. This prevents increase in the base-emitter potential of the power transistor and consequently increase of its collector-to-emitter current.

7 Claims, 2 Drawing Figures

COMPOSITE TRANSISTOR DEVICE WITH OVER CURRENT PROTECTION

The present invention relates to the over-current protection of transistor devices.

Over-current protection utilizing a sensing resistor in the emitter connection of a power amplifier output transistor is known. As the emitter current of the output transistor is increased, a potential is developed across the resistor. This potential may be applied to the base-emitter junction of an auxiliary transistor having its collector electrode connected to the base electrode of the output transistor. If the potential developed across the sensing resistor exceeds a threshold value, the auxiliary transistor will be biased into conduction and will act to clamp the base drive to the output transistor, limiting the current in its output circuit.

In the present invention, the base-emitter junctions of a power transistor and an auxiliary transistor are paralleled. The smaller collector current of the auxiliary transistor can be sampled so as to indirectly sample the larger collector current of the power transistor. When the indirect sampling indicates that the collector current in the power transistor is tending to exceed its rated maximum value its base and emitter electrodes are clamped. This prevents substantial further increase in the base emitter potential of the power transistor and limits further increase in its collector-to-emitter current.

Figure 1:
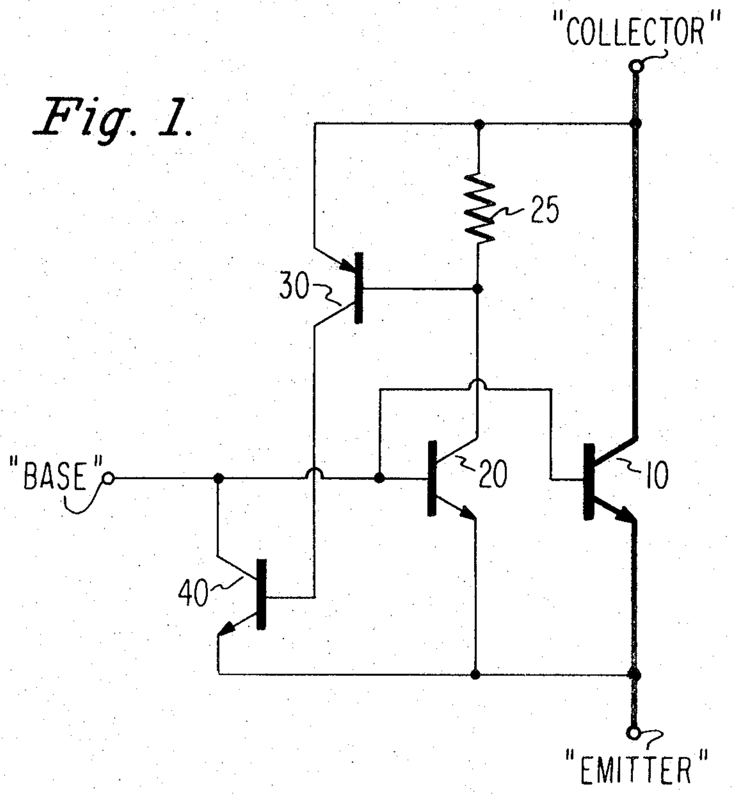
Figure 2:
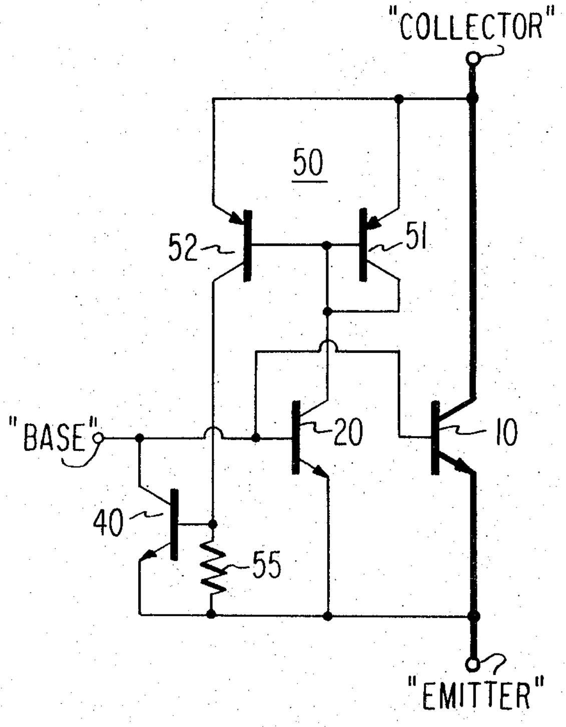

In the drawing, FIGS. 1 and 2 are each a schematic diagram of a composite transistor device having over-current protection provided according the present invention.

Consider the composite transistor device shown in FIG. 1. Preferably, the component elements 10, 20, 25, 30, 40 of the composite transistor device are formed within the confines of an integrated circuit - that is, upon the same semiconductor die.

Transistor 10 is a power transistor having its base, emitter and collector electrodes connected to the "base", "emitter" and "collector" terminals of the composite device. Transistor 10 may in actuality, be formed from a number of paralleled component transistors. An auxiliary transistor 20 has its base-emitter junction connected in parallel with the base-emitter junction of transistor 10. Transistors 10 and 20 are thermally coupled to each other.

The auxiliary transistor 20, having the same base-emitter potential ($V_{BE}$) applied to it as transistor 10, tends to have the same current density in its base-emitter junction as does transistor 10. By making transistor 20 have a smaller base-emitter junction area than that of transistor 10 by a factor K, the current flowing through the base-emitter junction of transistor 20 will be 1/K times the current flowing through the base-emitter junction of transistor 10. That is, the emitter current of transistor 20 will be 1/K times the emitter current of transistor 10.

The collector electrode of transistor 20 is connected by a resistive element 25 to the "collector" terminal of the composite transistor device. A potential is developed across the resistive element 25 which is proportional to the collector current of transistor 20, in accordance with Ohm's Law. Since the emitter currents of transistors 10 and 20 respectively are in ratio K:1, so are their respective collector currents. The resistive element 25, in effect, samples one part in K of the collector current of power transistor 10. Since it, in effect, samples only a fraction of the collector current of transistor 10, resistive element 25 can be made to have a resistance K times as large as a resistor sampling the collector or emitter current of transistor 10 directly and still develop the same potential in response to sampling.

The larger resistance resistive element 25 is more easily integrated into the same monolithic structure with transistors 10 and 20 than a lower resistance resistive element since it takes up less area on the die. Since the resistive element 25 is in the collector circuit of a transistor, it can be fabricated in the buried layer or "pocket" region used to provide a high conductivity interconnection between various portions of the collector region, which also conserves area on the die.

The resistance of the resistive element 25 is chosen to be of such value that when the collector current of transistor 10 tends to exceed a predetermined value of current, the potential across resistive element 25 becomes large enough to bias the base-emitter junction of transistor 30 into conduction. When the transistor 30 is so biased, it allows current to flow to the base electrode of transistor 40. This base current into transistor 40 biases the transistor 40 into conduction. The transistor 40, when conductive, clamps the "base" and "emitter" terminals of the composite device together. This prohibits the base-emitter potentials of transistors 10 and 20 from becoming larger in circuits where the impedance of the source (not shown) driving the base-emitter junctions of transistors 10 and 20 is not excessively low. Since the base-emitter potentials of transistors 10 and 20 are constrained in their increase, the current levels in transistors 10 and 20 are constrained in their increase.

At lower values of collector current in transistors 10 and 20, the potential drop across the resistive element 25 will be insufficiently large to forward bias the base-emitter junction of transistor 30. Transistor 30 consequently will be non-conductive and will not permit base current flow to transistor 40. Consequently, transistor 40 will be non-conductive. Therefore, transistor 40 will have no effect upon signals applied between the "base" and "emitter" terminals of the composite device.

In an integrated circuit, a PNP transistor such as transistor 30 is conventionally formed with a lateral structure. Its collector capacitance is sufficiently large to provide the dominant time constant in the feedback loop formed by elements 20, 25, 30, 40, when it has no collector resistance, as shown, or a collector resistor of suitable large resistance. This precludes problems of the loop tending to be oscillatory at frequencies near the high frequency cut-off of the transistors 20, 30 or 40.

To one skilled in the art, a number of variations upon the basic circuit set forth in FIG. 1 will suggest themselves. For example, a common-collector transistor amplifier stage may be used to buffer the "base" terminal from the loading presented by the base electrodes of transistors 10 and 20. The common-collector transistor collector electrode may be connected to the collector electrode of transistor 10 or of transistor 20. For example, transistor 40 may be replaced by a Darlington configuration. Resistive element 25 may include a temperature-compensating diode, and transistor 30 may have an emitter degeneration resistor, for example.

The ratio of the collector currents of transistors 10 and 20 may be altered by the inclusion of an element coupling the emitter electrode of either transistor to the "emitter" terminal or by elements coupling both their emitter electrodes to the "emitter" terminal also. This alternative is practically a necessity when the composite device is to be built up out of discrete components, since then it is more difficult to get close matching of the operating characteristics of transistors 10 and 20 and close thermal coupling of these transistors which facilitate the invention.

FIG. 2 shows another basic embodiment of the present invention. As in the FIG. 1 configuration, the power transistor 10 has its base emitter junction paralleled by the base-emitter junction of an auxiliary transistor 20. The auxiliary transistor 20 has a collector current flow proportional to and smaller than the collector current of the power transistor 10. The current amplifier 50 provides from its output circuit a current proportionally responsive to the collector current of transistor 20 applied to its input. This output current from current amplifier 50 flows through resistor 55.

When the collector current of transistor 20 is large enough, the potential drop developed across resistor 55 will exceed the base-emitter offset potential of transistor 40 and bias transistor 40 into conduction. When transistor 40 is biased into conduction, it will provide clamping of the base-emitter potentials of transistors 10 and 20, if the impedance presented to the "base" electrode of the composite device is not so low as to prevent such clamping. The clamping of the base-emitter potentials of transistors 10 and 20 will prevent substantial further increase of their collector-to-emitter currents.

The current amplifier 50 is shown in FIG. 2 as comprising a common-emitter transistor 52, having its current gain stabilized against changes of its common-emitter forward current gain characteristic, $h_{fe}$, by a diode-connected transistor 51 connected in parallel with its base-emitter junction. Other forms of semiconductor diode can replace transistor 51, and diode-connected transistor 51 or any of its replacements may have a resistive element serially connected therewith. While the current gain of the current amplifier 50 will not be so well stabilized against changes in the $h_{fe}$ of transistor 52, its gain will be slightly increased. The current amplifier 50 typically has a current gain of −1, although it may be higher or lower.

What is claimed is:

1. A composite transistor device with over-current protection comprising:

a power transistor and an auxiliary transistor thermally coupled to each other, each having a collector electrode, each having a base electrode which base electrodes are interconnected, and each having an emitter electrode which emitter electrodes are interconnected;

a connection between the collector electrodes of said power and said auxiliary transistors;

means for detecting when the collector current flow of said auxiliary transistor flowing through said connection exceeds a predetermined value thus to provide a signal indicative of an over-current condition; and means for clamping the potential appearing between the base and the emitter electrodes of said power transistor in response to said signal indicative of an over-current condition.

2. A device as claimed in claim 1 wherein said means for detecting when the collector current flow of said auxiliary transistor flowing through said connection exceeds a predetermined value thus to provide a signal indicative of an over-current condition comprises:

a resistive element connected between the collector electrodes of said power transistor and said auxiliary transistor and;

a complementary transistor being of opposite conductivity type to said power transistor and said auxiliary transistor, having an emitter and a base electrodes respectively connected to the collector electrode of said power transistor and to the collector electrode of said auxiliary transistor, and having a collector electrode for providing said signal indicative of an over-current condition.

3. A device as claimed in claim 2 wherein said means for clamping the potential appearing between the base and emitter electrodes of said power transistor comprises:

a clamping transistor being of the same conductivity tyep as said power and said auxiliary transistors, having a collector and an emitter electrodes respectively connected to the base and emitter electrodes of said power transistor, and having a base electrode connected to receive said signal indicative of an over-current condition.

4. In combination:

four transistors, each having base, collector and emitter electrodes, the first and second of said transistors connected base electrode-to-base electrode and emitter electrode-to-emitter electrode, the first and second and third of said transistors being of one conductivity type and the fourth of another conductivity type;

a current sensing element connected to the collector of said first transistor for sensing the collector current of said transistor;

the emitter-to-collector path of said third transistor being connected across the emitter-to-base path of said first transistor;

the emitter-to-base path of said fourth transistor being connected across said current sensing element in a direction to produce emitter-to-base current flow in said fourth transistor when the current flow in said sensing element exceeds a given value; and the collector electrode of said fourth transistor connected to the base of said third transistor for delivering the collector current of said fourth transistor to the base-emitter path of said third transistor.

5. In the combination as set forth in claim 4, said first transistor having an effective emitter-base junction area which is substantially larger than that of said second transistor.

6. Composite transistor device with over-current protection comprising:

a first and a second and a third terminals, corresponding respectively to the "emitter", "base" and "collector" electrodes of said composite transistor device;

a first and a second and a third transistors, each having a base and an emitter and a collector electrodes, said first and said third transistors being of a conductivity type complementary to that of said second transistor and having their emitter electrodes connected to said first terminal, said third transistor collector electrode being connected to said first transistor base electrode which is connected to said second terminal, said second transistor collector electrode being coupled to said third transistor base electrode, said second transistor emitter electrode being connected to said third terminal;

a resistance connected between said third terminal and an interconnection of said first transistor collector electrode and said second transistor base electrode; and at least one further transistor of the same conductivity type as said first transistor having an emitter electrode connected to said first terminal, having a base electrode connected to said second terminal, and having a collector electrode connected to said third terminal.

7. Composite transistor device with over-current protection comprising:

a first and a second and a third terminals, corresponding respectively to the "emitter", "base" and "collector" electrodes of said composite transistor device;

a first and a second transistors of the same conductivity type, each having a base and an emitter and a collector electrodes, having their emitter electrodes connected to said first terminal, said second transistor collector electrode being connected to said first transistor base electrode which is connected to said second terminal;

a resistive element connecting said second transistor base electrode to said first terminal; and a third and a fourth transistors of a conductivity type opposite to that of said first and said second transistor, said third and said fourth transistors each having an emitter electrode connected to said third terminal, said third and said fourth transistors each having a collector electrode, said third transistor collector electrode being connected to said first transistor collector electrode, said fourth transistor collector electrode being connected to said second transistor base electrode, said third and said fourth transistors each having a base electrode connected to said third transistor collector electrode.

* * * * *